United States Patent
Fukunaga et al.

[11] Patent Number: 5,950,925
[45] Date of Patent: Sep. 14, 1999

[54] REACTANT GAS EJECTOR HEAD

[75] Inventors: Yukio Fukunaga, Yokohama; Hiroyuki Shinozaki, Fujisawa; Kiwamu Tsukamoto, Fujisawa; Masao Saitoh, Fujisawa, all of Japan

[73] Assignee: Ebara Corporation, Tokyo, Japan

[21] Appl. No.: 08/948,579

[22] Filed: Oct. 10, 1997

[30] Foreign Application Priority Data

Oct. 11, 1996 [JP] Japan .................................. 8-289221

[51] Int. Cl.$^6$ .................................................. C23C 16/00
[52] U.S. Cl. ...................... 239/132.3; 239/139; 239/428; 239/432; 118/715
[58] Field of Search ..................................... 239/432, 428, 239/423, 424, 128, 132, 132.3, 139; 427/255.1, 255.2, 422, 574, 585, 507; 118/715, 724, 725, 726

[56] References Cited

U.S. PATENT DOCUMENTS

| | | | |
|---|---|---|---|
| 1,508,843 | 9/1924 | Caldwell | 239/558 X |
| 2,590,948 | 4/1952 | Du Perow | 239/423 |
| 4,655,395 | 4/1987 | Cioffi et al. | 239/432 X |
| 5,106,453 | 4/1992 | Benko et al. . | |
| 5,113,829 | 5/1992 | Nakagawa et al. | 165/61 |
| 5,332,442 | 7/1994 | Kubodera et al. . | |
| 5,378,501 | 1/1995 | Foster et al. | 427/255.2 |
| 5,451,435 | 9/1995 | Yu . | |
| 5,453,124 | 9/1995 | Moslehi et al. . | |
| 5,624,498 | 4/1997 | Lee et al. | 118/715 |
| 5,728,223 | 3/1998 | Murakami et al. | 118/715 |

FOREIGN PATENT DOCUMENTS

| | | |
|---|---|---|
| 2-73624 | 3/1990 | Japan . |
| 5-144753 | 6/1993 | Japan . |
| 8-26460 | 3/1996 | Japan . |
| 2533685 | 6/1996 | Japan . |
| 08325736 | 12/1996 | Japan . |
| 09002896 | 1/1997 | Japan . |

OTHER PUBLICATIONS

Copending U.S. Patent Application filed Apr. 19, 1996 entitled "Thin–Film Vapor Deposition Apparatus", by Noriyuki Takeuchi, Serial No. 08/634,847.

*Primary Examiner*—Kevin Weldon
*Attorney, Agent, or Firm*—Wenderoth, Lind & Ponack, L.L.P.

[57] ABSTRACT

A reactant gas ejector head enables a process gas mixture of a uniform concentration and composition to be delivered to the surface of a substrate in a stable and uniform thermodynamic state by preventing premature reactions to occur along the gas delivery route. The reactant gas ejector head comprises an ejection head body having a back plate and a nozzle plate for defining a gas mixing space therebetween. The nozzle plate has numerous gas ejection nozzles. A gas supply pipe is communicated with the ejection head body through a center region of the back plate so as to separately introduce at least two types of gaseous substances into the mixing space. Gas distribution passages are formed between the back plate and the nozzle plate in such a way as to guide the at least two types of gaseous substances from the gas supply pipe to be directed separately towards peripheral regions of the gas mixing space.

8 Claims, 6 Drawing Sheets

REACTANT GAS EJECTOR HEAD

BACKGROUND OF THE INVENTION

1. Field of the Invention

The present invention relates in general to a reactant gas ejector head for use in chemical vapor deposition apparatus for forming thin films, and relates in particular to an ejector head suitable for use in forming high dielectric or ferroelectric films such as barium/strontium titanates.

2. Description of the Related Art

In recent years, there has been a remarkable progress in circuit density of integrated circuit devices produced by the semiconductor industry, and intense development activities are underway in anticipation of gig-bit order DRAMs replacing the prevailing meager-bit order DRAMs of today. Dielectric thin film materials used to make high capacitance devices necessary for producing DRAMs have, in the past, included silicon oxide or silicon nitride films of dielectric constant less than 10, tantalum pentaoxide ($Ta_2O_5$) films of dielectric constant about 20; however, newer materials such as barium titanate ($BaTiO_3$) or strontium titanate ($SrTiO_3$) or mixtures of these compounds appear to be more promising.

Vapor deposition processes of such metal oxide thin films require one or a plurality of organo-metallic gaseous substances, termed a material gas, and an oxidizing gas, which must be mixed together uniformly, heated to a specific temperature and directed onto a substrate as a reactant gas flow. Some gas ejector heads have been proposed for such a purpose.

However, the conventional reactant gas ejector heads are unable to satisfy the rigorous requirements of organo-metallic chemical vapor deposition processes. In general, such gaseous mixtures of organo-metallic material gas and oxidizing gas, termed a process gas, can exist in a stable thermodynamic state only in a narrow range of temperatures, so that if the temperature distribution is non-uniform along its pathway to the substrate, component gases in the process gas can easily condense or decompose. For example, as the flow passage of the gaseous mixture becomes longer, the mixture of material gas and oxidizing gas can easily be affected by temperature variations to become thermodynamically unstable, permitting some undesirable premature reactions to take place before it reaches the substrate so as to produce unintentional depositions. Such depositions may plug up gas ejection nozzles or may flow downstream to contaminate the deposition film on the substrate.

If, on the other hand, the material gas and the oxidizing gas are mixed after they have passed through the ejection nozzle, although plugging of the ejection nozzles may be avoided, it becomes extremely difficult to uniformly mix the gases in the short distance available to the substrate. Attempts to produce uniform mixing by making the ejection nozzles finer or increasing the distance between the ejector head and the substrate are not practical solutions, because such approaches will only make the apparatus more complicated and undesirably large.

SUMMARY OF THE INVENTION

It is an object of the present invention to provide a reactant gas ejector head to enable a process gas mixture of a uniform concentration and composition to be delivered to the surface of a substrate in a stable thermodynamic state by preventing premature reactions from occuring along the gas delivery route.

Such object has been achieved in a reactant gas ejector head comprising: an ejection head body having a back plate and a nozzle plate for defining a gas mixing space therebetween, the nozzle plate having numerous gas ejection nozzles; and a gas supply pipe communicating with the ejection head body through a center region of the back plate so as to separately introduce at least two types of gaseous substances into the mixing space, wherein gas distribution passages are formed between the back plate and the nozzle plate in such a way to guide the at least two types of gaseous substances from the gas supply pipe separately towards peripheral regions of the gas mixing space.

In the present device, the shape of the gas distribution passages can be modified to suit any application, for example, a design of radially extending grooves or of planar spacing between two plates may be used. The gaseous substances are separately delivered to the edge of a mixing space along the distribution passages, and are directed towards the periphery of the mixing space, and then the flows turn towards the center region of the mixing space. At the peripheral region of the mixing space, since the gases flow to reverse direction almost 180 degrees, while dispersing in peripheral directions, intensive turbulence is generated in the flow so that mixing of the reactant gases can be effectively produced. The uniformly mixed process gas flows out of the second mixing space successively through numerous gas ejection nozzles to produce uniform ejection flows across the nozzle plate.

The ejector head may be provided with at least two distribution plates disposed between the back plate and the nozzle plate so as to form the gas distribution passages between the back plate and the nozzle plate. Accordingly, grooves or protrusions, for example, may be formed on these plates so that suitable gas distribution passages can be produced using a simple design. The planar space formed by these plate parts can be used directly to convey the gases. By providing close contact between the back plate and the distribution plate or between the distribution plates themselves, good thermal transfer between the parts can be maintained, so that the temperatures of the distribution plates can be controlled indirectly through the back plate which is readily accessible. Therefore, without forming thermal passages inside the distribution plates, the temperatures of the distribution passages can be controlled appropriately to prevent condensation or decomposition of the process gas inside the mixing space including the gas distribution passages.

The ejector head may have a dispersion plate having numerous gas dispersion holes in the gas mixing space formed between the back plate and the nozzle plate. Accordingly, a gas dispersion space is also created upstream of the nozzle plate so that not only further mixing of the process gas is achieved but also the distribution of pressures of the process gas across the entire nozzle plate is improved to deliver gaseous ejection flows of a uniform state onto the entire substrate surface.

A peripheral wall of the mixing space may comprise an inclined surface inclining towards a center region of the mixing space. This design is adopted to produce strong deflected flows at the periphery of the mixing space so that the process gas will disperse along the periphery to promote mixing of the process gas. The steep angle of the wall redirects the flow towards the center region so that uniformly mixed gas is directed along the periphery to the next stage of mixing and dispersion.

Temperature control means to maintain the gas distribution passages at required temperatures may be provided so that the temperature in the gas distribution passages can be controlled precisely to prevent condensation or decomposition of the process gas within the gas distribution passages.

The ejector head may be designed so that, as the process gas travels towards the downstream ejection nozzles, a total cross sectional area of the gas distribution passages becomes smaller than a cross sectional area of the gas supply pipe, and that a sum of cross sectional areas of the gas ejection nozzles becomes smaller than a sum of cross sectional areas of the gas dispersion holes. In other words, if $S_1$, $S_2$, $S_3$ and $S_4$ represent, respectively, cross sectional areas of the supply pipe, gas distribution passages, gas dispersion holes and the gas ejection nozzles, then they are related according to the following relationship:

$$S_1 > S_2 \text{ and } S_3 > S_4.$$

Accordingly, the distribution plates serve to create a back pressure to equalize the process gas pressure in the mixing space, as well as to equalize the pressures across the dispersion space so that the process gas can be ejected from all the ejection nozzles under a uniform driving force.

A reactant gas ejector head may comprise an annular narrowed passage portion between a peripheral area and a center region of the mixing space so that it can maintain the back pressure within the peripheral area thereby enabling control of the inward flow of the process gas into the center region.

The above and other objects, features, and advantages of the present invention will become apparent from the following description when taken in conjunction with the accompanying drawings which illustrate preferred embodiments of the present invention by way of example.

DESCRIPTION OF THE PREFERRED

A preferred embodiments of the gas ejector head will be explained with reference to FIGS. 1 to 6.

Figure 1:
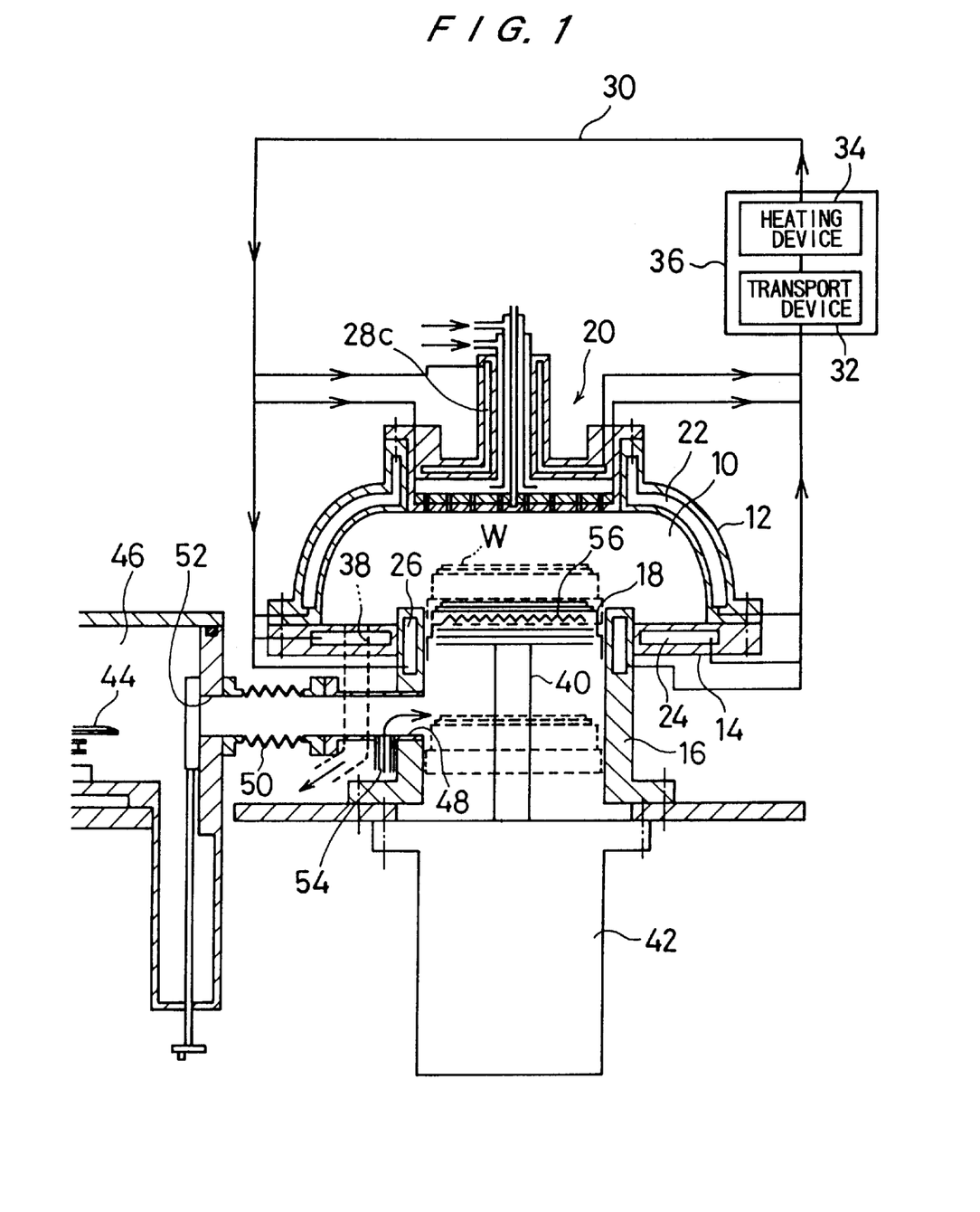
FIG. 1 is an overall cross sectional view of an embodiment of a thin film deposition apparatus of the present invention.

FIG. 1 shows an overall cross sectional view of a vapor deposition apparatus for forming thin films on a substrate W, comprising: a reaction chamber 10 including a vessel member 12; a susceptor (substrate holding means) 18 vertically movable inside a cylindrical member 16 which opens to the center region of a bottom member 14 of the vessel member 12; and an ejector head body 20 attached to the top end of the vessel member 12.

The vessel member 12, the bottom member 14, the cylindrical member 16 and the ejector head 20 are all provided with respective thermal medium passages 22, 24, 26, 28a and 28c for circulating a heated thermal medium, which are communicated through an external piping 30 with a thermal medium circulation unit 36 comprising a transport device 32, such as a pump, and a heating device 34. Although not shown in FIG. 1, there is also a cooling unit for circulating a cooling medium through certain sections of the apparatus. The bottom member 14 has an exhaust port 38 which is communicated with a vacuum pump (also not shown) for discharging exhaust gases.

The susceptor 18 is connected via a support shaft 40 to an elevator device 42 disposed below the reaction chamber 10 so as to enable to be lifted or lowered within the cylindrical member 16. A substrate delivery opening 48 is provided on the cylindrical member 16 at a suitable height to align with a robot chamber 46 comprising a robotic device 44. The substrate delivery opening 48 is connected through a bellows (passage) 50 to a gate 52 of the robot chamber 46. A purge gas supply opening 54 is provided to open at the substrate delivery opening 48. The susceptor 18 is provided with a heater 56 to heat the substrate W and maintains the temperature of the substrate W at a specific constant temperature by adjusting the power supply to the heater 56 in accordance with measurements of a substrate temperature sensor disposed in a suitable location.

Figure 2:
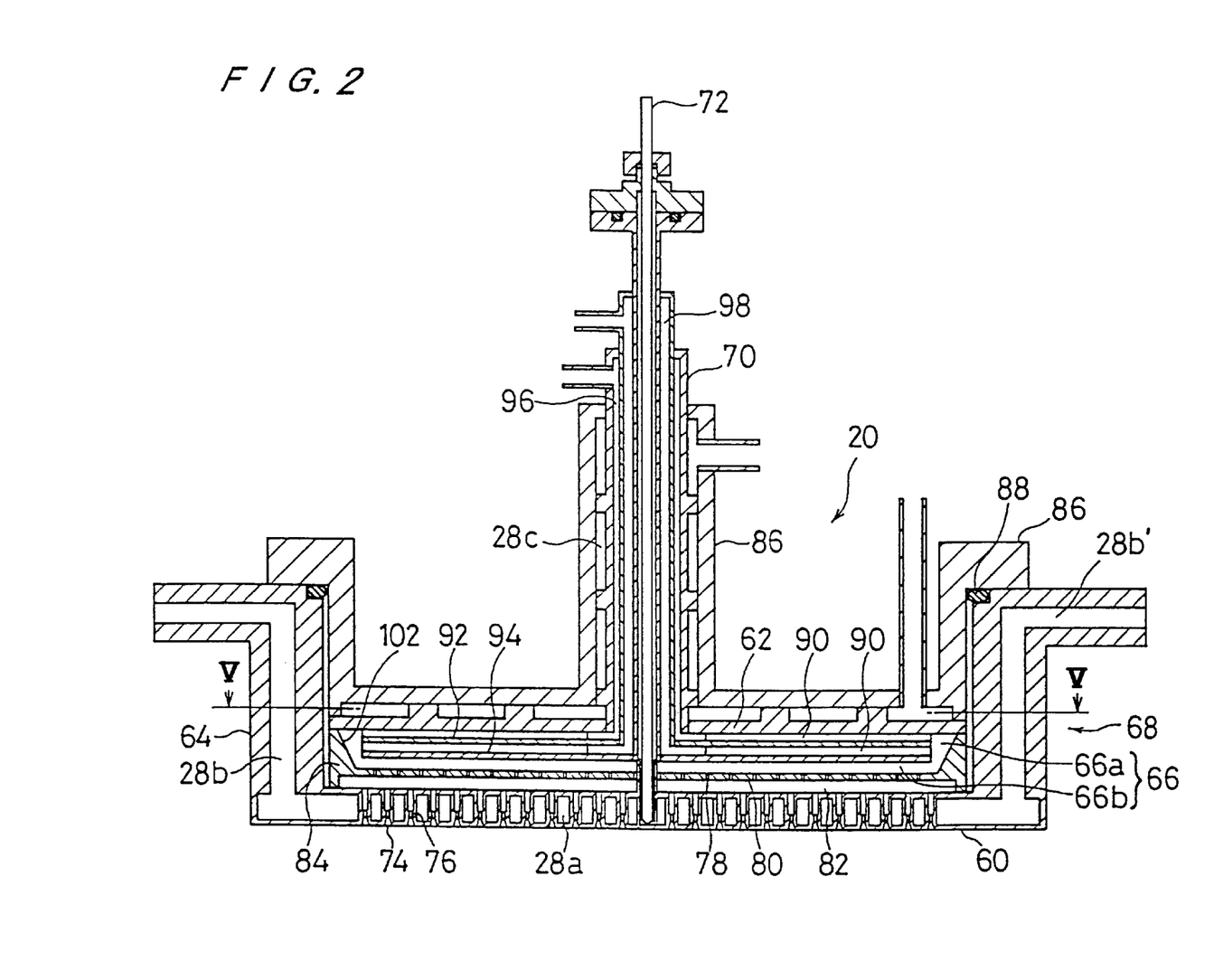
FIG. 2 is a cross sectional view of an ejector head of the present invention.

With reference to FIG. 2, the ejector head 20 comprises: a nozzle plate 60 facing the substrate W; an ejector head body 68 forming a disc-shaped mixing space 66 in association with a back plate 62 and a peripheral wall 64; and a gas supply pipe 70 extending from the back plate 62 to be connected to the ejector head body 68 so as to supply at least two types of reactant gases to the gas mixing space 66. The gas supply pipe 70 is a concentric multi-tube pipe provided with a thermocouple (temperature sensor) 72 which is inserted through the center to extend to the surface of the nozzle plate 60.

Figure 3:
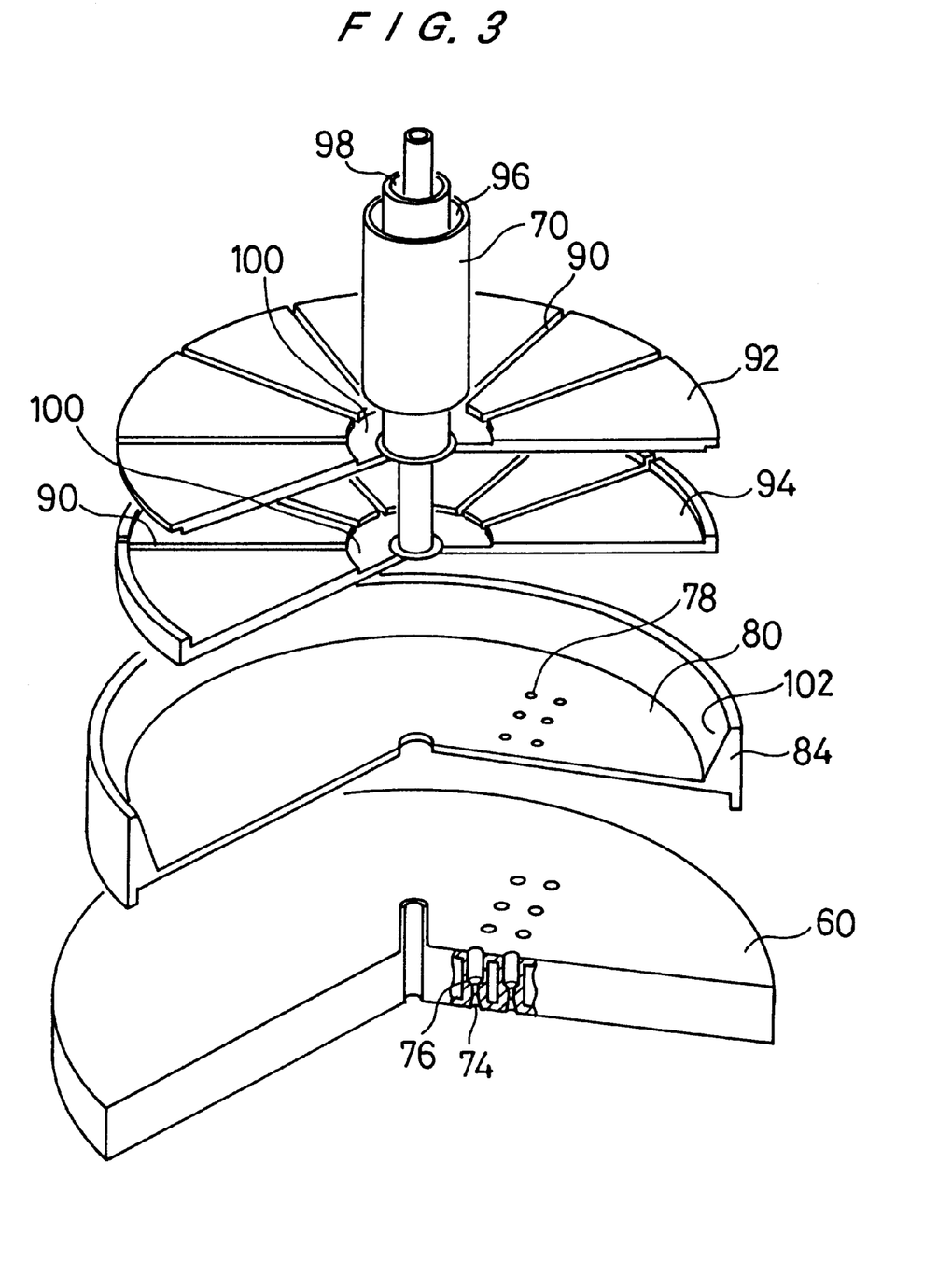
FIG. 3 is a disassembled view of a body of the ejector head.
Figure 4A:
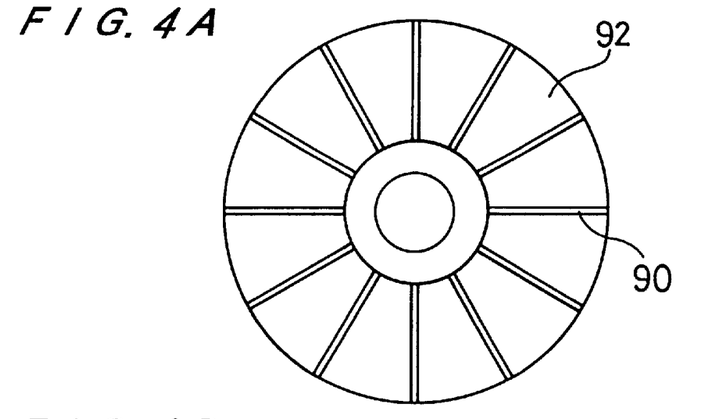
FIGS. 4A, 4B are plan views of distribution plates of the ejector head body.
Figure 4B:
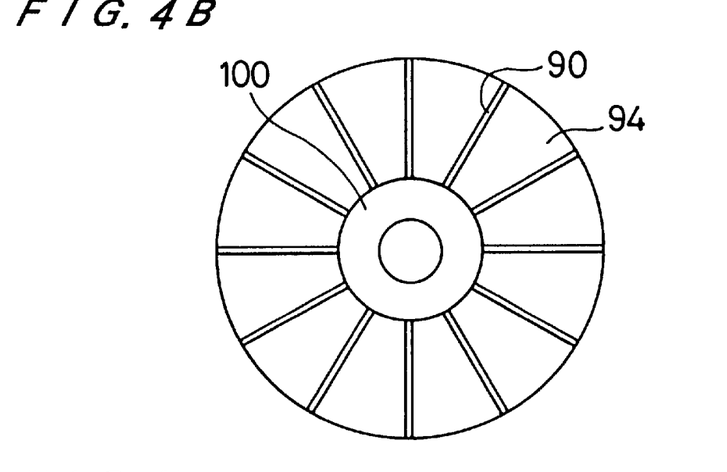
Figure 6:
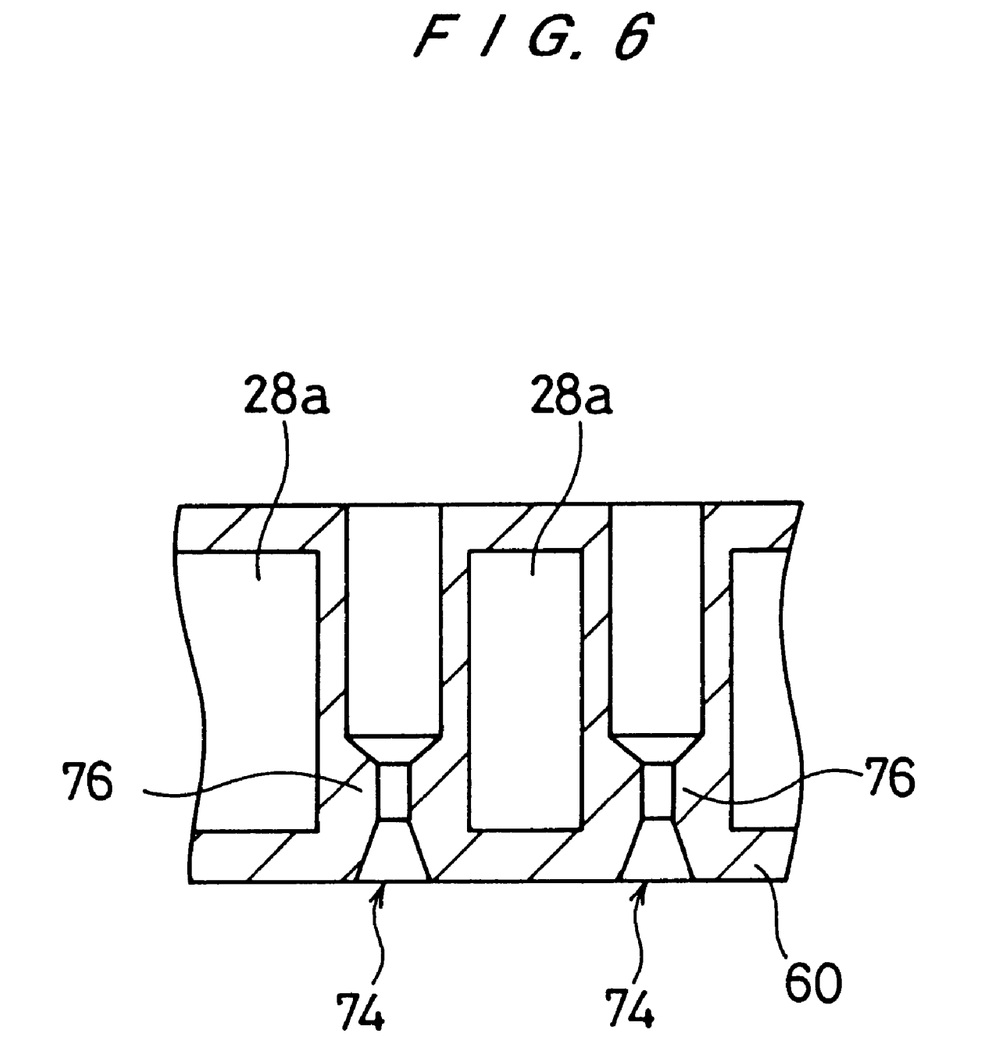
FIG. 6 is a cross sectional view of the essential parts of a nozzle plate.

With reference to FIG. 3, the nozzle plate 60 is slightly smaller than the substrate W, and is made as a unit with the vertically extending peripheral wall 64 to form a receptacle region for receiving an aftermentioned plates assembly above the nozzle plate 60. As shown in FIG. 6, the nozzle plate 60 comprises numerous nozzle elements 76, each having a gas ejection nozzle 74 shaped like a jet nozzle, and also includes thermal medium passage 28a formed around each of the nozzle elements 76. The gas inlet and outlet 28b, 28b' shown in FIG. 2 provide entry and exit locations for the thermal medium through the nozzle plate 60.

With reference to FIG. 3, various disc-shaped plates are stacked on top of the nozzle plate 60. First is a dispersion plate 80 having numerous gas dispersion holes 78 so as to form a gas dispersion space 82 in conjunction with the nozzle plate 60 shown in FIG. 2. The peripheral section of the dispersion plate 80 is formed into a vertically-extending retaining wall 84 so as to form gas mixing spaces above and below the dispersion plate 80. The gas dispersion holes 78 are disposed offset with respect to the gas ejection nozzles 74 on the nozzle plate 60 to avoid direct flow from a gas dispersion hole 78 to a gas ejection nozzle 74. The total cross sectional area $S_3$ for gas flow through the gas dispersion holes 78 is selected to be larger than the total cross sectional area $S_4$ for gas flow through the gas ejection nozzles 74. The back plate 62 is assembled so as to be in contact with the upper edge of the retaining wall 84 of the dispersion plate 80, and the concentric gas supply pipe 70 is attached through the center region of the back plate 62.

Figure 5:
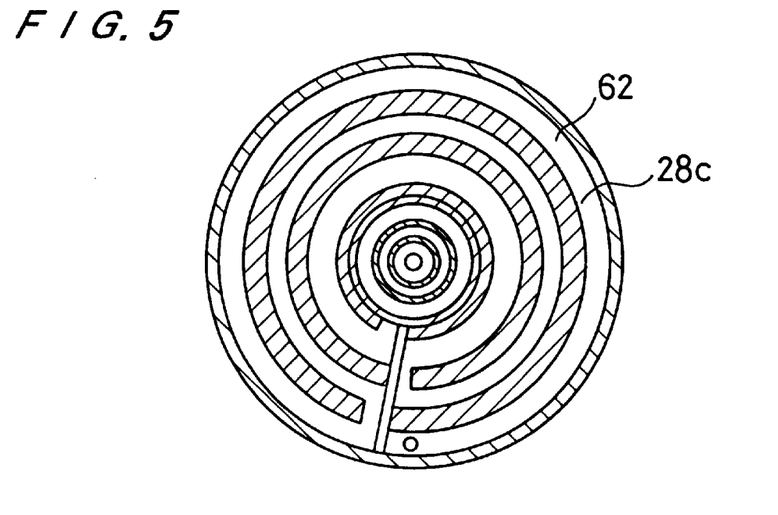
FIG. 5 is a plan view through section V—V in FIG. 2.

Outer shell 86 (refer to FIG. 2) is provided to cover the overall upper surface of the device, that is, the inside surface of the peripheral wall 64, the upper surface of the back plate 62 and the outer surface of the gas supply pipe 70. The outer shell 86 is fit inside the receptacle region with an intervening ring seal 88 disposed between itself and the peripheral wall 64. Thermal medium passage 28c is defined by the outer shell 86, the upper surface of the back plate 62 and the outer surface of the gas supply pipe 70, as shown in FIG. 5, to provide heat to the gas supply pipe 70 and distribution plates 92, 94, which are described hereafter.

In the space formed between the back plate 62 and the distribution plate 80, there are provided upper and lower distribution plates 92, 94, each having radially-extending channels (gas distribution passages) 90 formed on its respective upper surface, as shown in FIG. 3. In this example, an equal number of these channels 90 are formed on each of the distribution plates 92, 94 symmetrically about the axis. Outer gas supply passage 96 of the gas supply pipe 70 communicates with the channels 90 formed between the upper distribution plate 92 and the back plate 62 through a central gas distribution depression 100 formed on the upper distribution plate 92, and similarly, inner gas supply passage 98 communicates with the channels 90 formed between the upper and lower distribution plates 92, 94 through a central gas distribution depression 100 formed on the lower distribution plate 94.

A first mixing space 66a of a ring-shape is formed between the outer surfaces of the distribution plates 92, 94 and the retaining wall 84 of the dispersion plate 80; and a second mixing space 66b of a disc-shape is formed between the lower distribution plate 94 and the dispersion plate 80. These first and second mixing spaces 66a, 66b comprise the gas mixing space 66. In this example, the inner surface of the retaining wall 84 forms an inclined surface 102 inclining towards the center of the dispersion plate 80 so that it can deflect the feed gas and the oxidizing gas discharged separately through the channels 90 of the distribution plates 92, 94 so as to mix them in the first mixing space 66 and smoothly guide them to the second mixing space 66b.

It should be noted that the distribution plate 92 and the back plate 62 on the one hand, and the distribution plates 92, 94 themselves on the other, are in close contact with each other in all regions excepting at the channels 90 so as to ensure good thermal contact to the back plate 62. Since the back plate 62 is held at a specific temperature by means of the thermal medium flowing through the thermal medium passage 28c, the distribution plates 92, 94 are also maintained at temperatures which would not induce condensation or decomposition of the material gas.

The ejector head is designed so that the process gas, i.e. a mixture of material gas and oxidizing gas, will flow through gas passages whose cross sectional areas are designed to decrease gradually as the process gas travels downstream. In other words, a relationship exists among the total cross sectional areas $S_1$, $S_2$, $S_3$ and $S_4$ such that:

$S_1 > S_2$, $S_3 > S_4$ where $S_1$ is a sum of the cross sectional areas of the two passages 96, 98 of the gas supply pipe 70; $S_2$ is a sum of the cross sectional areas of the channels 90 of the two distribution plates 92, 94, $S_3$ is a sum of the cross sectional areas of the dispersion holes 78 of the dispersion plate 80, and $S_4$ is a sum of the cross sectional areas of the gas ejection nozzles 74 in the nozzle plate 60. Accordingly, fluctuation of the process gas pressures in the various flow passages, i.e., channels 90 on the distribution plates 92, 94, and the gas dispersion space 82 are controlled by generating appropriate degree of back pressures thereby to produce a uniform ejection of process gas from all the gas ejection nozzles 74 across the nozzle plate 60.

The number of channels to be formed in the distribution plates 92, 94 is determined by two opposing factors: from the standpoint of distributing the gases uniformly in the radial direction, the number of channels should be high; however, from the standpoint of machining effort, it is preferable to have a lesser number of channels. In this example, it was found that the apparatus performs well when the number of channels was such that the peripheral spacing between the neighboring openings of the channels 90 is smaller than 45 mm.

The operation of the reactant gas ejector head will be explained in the following. The material gas and oxidizing gas are introduced separately into the supply pipe 70 from their respective supply sources (not shown). The material gas is produced, for example, by vaporizing a solution made by dissolving organo-metallic compounds such as $Ba(DPM)_2$, $Sr(DPM)_2$ and $Ti(i-OC_3H_7)$ in a solvent and mixing the generated vapor with a carrier gas such as Ar. The oxidizing gas may be selected from oxygen-containing gases such as $O_2$, $N_2O$, $H_2O$, with or without an addition of ozone gas, $O_3$, generated by an ozonizer.

The gases are introduced separately from the gas supply pipe 70 (in this example, the material gas from supply passage 96, and the oxidizing gas from supply passage 98) and after flowing through the respective gas distribution depressions 100 and the channels 90, the material gas and the oxidizing gas are independently guided into the first mixing space 66a, and are respectively directed towards the inclined surface 102 where the gases meet and are deflected to flow into and towards the center region of the second mixing space 66b. In the overall process, the material gas and the oxidizing gas are dispersed and mixed with each other in both mixing spaces 66a, 66b. Mixing is particularly well achieved in the first mixing space 66a because of intensive turbulence in the complex flow patterns of the gases, which spread out of the openings of the channels along the peripheral directions and simultaneously flow downward along the inclined surface 102 of the retaining wall 84.

In the second mixing space 66b, the process gas flows from the periphery towards the center region. As the process gas is flowing into the second mixing space 66b, the gas diffuses through successive dispersion holes 78 into the dispersion space 82 formed below the dispersion plate 80. Because the second mixing space 66b is disc-shaped, a larger volume of process gas flowing into the peripheral region is received by a larger cross sectional flow area, while near the center region, where the flow volume is less, the cross sectional flow area is also smaller. The overall effect is that the pressures of the process gas become more even across the dispersion plate 80, and the resulting flow pattern becomes smooth and little pressure fluctuation or turbulence will be generated in the second mixing space 66b. In the dispersion space 82, the outflowing process gas is met by a condition that the nozzle elements 76 and the dispersion plate 80 are designed to achieve a relationship $S_3 > S_4$. This condition assists in generating a back pressure in the dispersion space 82, resulting in a uniform driving force for ejecting the process gas through the ejection nozzles 74 of the nozzle element 76.

In the course of the operation presented above, various critical sections of the apparatus are maintained at suitable predetermined temperatures by circulating the thermal medium, supplied from the thermal unit 36 through the thermal medium flow pipe 30, into the thermal medium passages 28 in the nozzle plate 60, peripheral wall 64, the outer shell 86 and the back plate 62. The back plate 62 and the upper distribution plate 92, the distribution plates 92, 94 themselves are in intimate contact, except at the channels 90, to maintain good heat transfer to each other. Therefore, the temperature of the distribution plates 92, 94 can be indirectly controlled by controlling the temperature of the back plate 62, so as to enable the temperature of the channels 90 to be regulated at suitable temperatures to prevent condensation or decomposition of the material gas and the oxidizing gas.

Figure 7A:
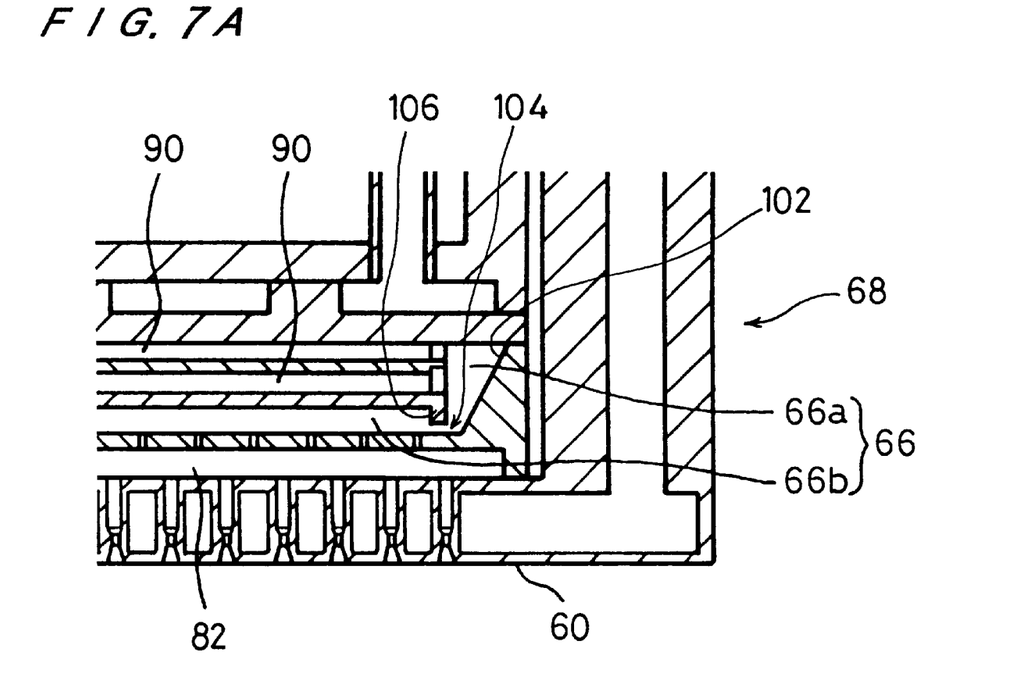
FIGS. 7A and 7B are enlarged cross sectional view of the ejector head of other embodiments of the present invention.
Figure 7B:
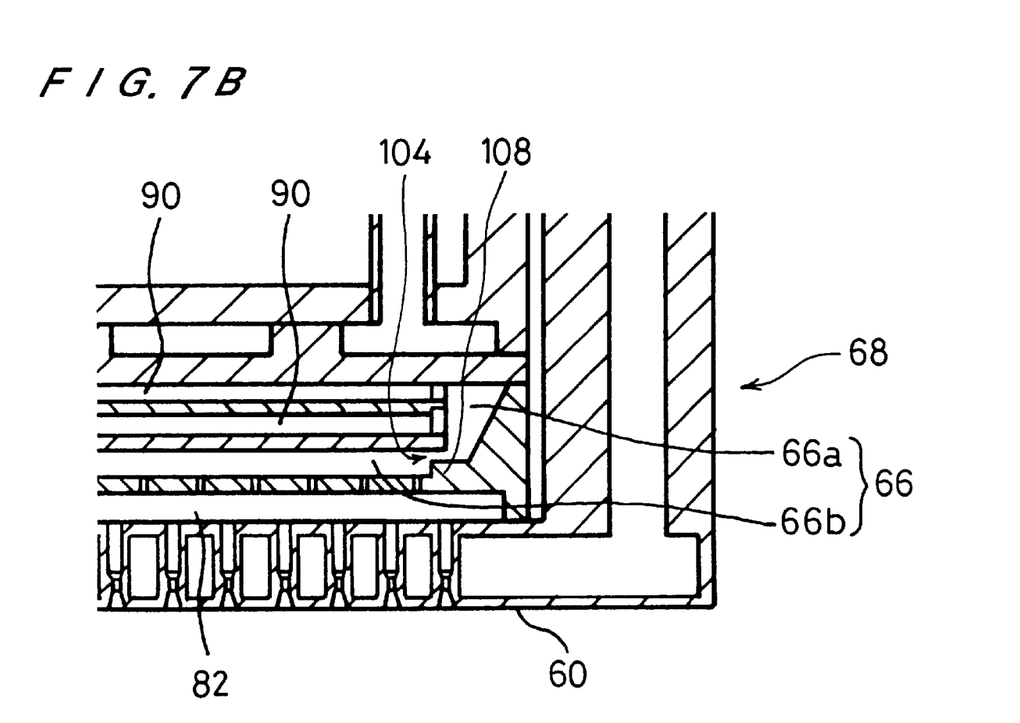

FIGS. 7A and 7B show other embodiments of the gas ejector head, wherein a narrowed passage portion 104 is provided at the boundary region between the first mixing space 66a and second mixing space 66b. In the embodiment shown in FIG. 7A, an annular projection 106 is provided on the edge of the lower surface of the lower distribution plate 94 to form annular narrowed passage portion 104 with the upper surface of the dispersion plate 80. In the embodiment shown in FIG. 7B, an annular projection 108 is provided at the corner below the inclined surface 102 on the upper surface of the dispersion plate 80. The flow passage area of the narrowed portion 104 is selected so as not to exceed that of the first mixing space 66a.

With such a configuration, the ejector head can maintain the back pressure within the first gas mixing space 66a, thus making it possible to control the inward flow of the process gas into the second gas mixing space 66b uniformly along the peripheral direction, thereby to generate a uniform and stable gas pressure distribution in the second gas mixing space 66b. Therefore, the uniformity of the gas flow flowing into the dispersion space 82 through the dispersion plate 80 is maintained across the dispersion plate 80 to finally enhance the uniformity of the gas flow flowing out of the nozzle elements 76 across the nozzle plate 60.

What is claimed is:

1. A reactant gas ejector head for use in a vapor deposition apparatus, said head comprising:

an ejector head body having a back plate and a nozzle plate for defining a gas mixing space therebetween, said nozzle plate having numerous gas ejection nozzles;

a gas supply communicating with said ejector head body through a center region of said back plate so as to separately introduce at least two gaseous substances into said mixing space; and gas distribution passages formed between said back plate and said nozzle plate to guide said at least two types of gaseous substances from said gas supply separately towards peripheral regions of said gas mixing space.

2. A reactant gas ejector head according to claim 1, wherein at least two distribution plates are disposed between said back plate and said nozzle plate so as to form said gas distribution passages between said back plate and said nozzle plate.

3. A reactant gas ejector head according to claim 1, wherein a dispersion plate having numerous gas dispersion holes is provided in said gas mixing space formed between said back plate and said nozzle plate.

4. A reactant gas ejector head according to claim 3, wherein a sum of cross sectional areas of said gas ejection nozzles is smaller than a sum of cross sectional areas of said gas dispersion holes.

5. A reactant gas ejector head according to claim 1, wherein a peripheral wall defining said mixing space comprises an inclined surface inclining towards a center region of said mixing space.

6. A reactant gas ejector head according to claim 1, further comprising temperature control means to maintain said gas distribution passages and said nozzle plate at required temperatures.

7. A reactant gas ejector head according to claim 1, wherein a total cross sectional area of said gas distribution passages is smaller than a total cross sectional area of said gas supply.

8. A reactant gas ejector head according to claim 1, wherein an annular narrowed passage portion is provided between a peripheral area and a center region of said mixing space.

* * * * *